(12) United States Patent
Cheng et al.

(10) Patent No.: US 9,425,436 B2
(45) Date of Patent: Aug. 23, 2016

(54) METHOD OF MAKING ORGANIC LIGHT EMITTING DIODE ARRAY

(71) Applicants: Tsinghua University, Beijing (CN); HON HAI PRECISION INDUSTRY CO., LTD., New Taipei (TW)

(72) Inventors: Jung-An Cheng, New Taipei (TW); Liang-Neng Chien, New Taipei (TW); Dong An, Beijing (CN); Zhen-Dong Zhu, Beijing (CN); Chang-Ting Lin, New Taipei (TW); I-Wei Wu, New Taipei (TW); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/468,348

(22) Filed: Aug. 26, 2014

(65) Prior Publication Data
US 2015/0155493 A1 Jun. 4, 2015

(30) Foreign Application Priority Data

Nov. 29, 2013 (CN) .................. 2013 1 06193003

(51) Int. Cl.
| | |
|---|---|
| *H01L 51/56* | (2006.01) |
| *H01L 27/32* | (2006.01) |
| *H01L 51/00* | (2006.01) |
| *H01L 51/52* | (2006.01) |

(52) U.S. Cl.
CPC ............ *H01L 51/56* (2013.01); *H01L 27/3211* (2013.01); *H01L 51/0014* (2013.01); *H01L 51/5265* (2013.01); *H01L 2251/105* (2013.01)

(58) Field of Classification Search
CPC .................... H01L 2251/105; H01L 27/3202; H01L 27/3241; H01L 27/3211; H01L 27/3216; H01L 27/3218; H01L 51/56
See application file for complete search history.

(56) References Cited

U.S. PATENT DOCUMENTS

| 8,940,568 B2 * | 1/2015 | Mohan et al. .................... 438/46 |
|---|---|---|
| 8,946,735 B2 * | 2/2015 | Lee et al. .......................... 257/89 |
| 2012/0214272 A1 * | 8/2012 | Azuma et al. .................... 438/82 |

* cited by examiner

*Primary Examiner* — Yu-Hsi D Sun
(74) *Attorney, Agent, or Firm* — ScienBiziP, P.C.

(57) ABSTRACT

A method of making organic light emitting diode array includes following steps. A base having a number of first electrodes on a surface of the base is provided. A first organic layer is located on the surface of the base to cover the first electrodes. A template with a first patterned surface is provided, wherein the first patterned surface includes a number of grooves with different depths. The first patterned surface of the template is attached on the first organic layer and separated from each other, wherein a number of protruding structures with different heights is formed. An organic light emitting layer is deposited to cover the protruding structures. A second organic layer is located on the organic light emitting layer. A second electrode is applied to electrically connected to the second organic layer.

17 Claims, 3 Drawing Sheets

METHOD OF MAKING ORGANIC LIGHT
EMITTING DIODE ARRAY

CROSS-REFERENCE TO RELATED APPLICATIONS

This application claims all benefits accruing under 35 U.S.C. §119 from China Patent Application No. 201310619300.3, filed on Nov. 29, 2013, in the China Intellectual Property Office, the disclosure of which is incorporated herein by reference.

FIELD

The present disclosure relates to a method of making organic light emitting diode array, particularly to a method of making organic light emitting diode array based on nanoimprinting method.

BACKGROUND

Organic light emitting diodes are a type of light emitting diode that is made of thin films of organic molecules. A display screen using the organic light emitting diodes need no back light source, can save electric energy, and has greater angle of visibility. Thus, the organic light emitting diodes attract more and more attention.

A conventional method for making the organic light emitting diodes is to make a plurality of organic light emitting diodes on a base to form an array. The method includes: forming a thin-film transistor (TFT) array on the base; applying a first insulative layer on the thin-film transistor array; forming a plurality of first electrodes on the first insulative layer; applying a second insulative layer on the first insulative layer to cover the edges of each of plurality of first electrodes to expose the middle portion of each of plurality of first electrodes; depositing an organic light emitting layer on the middle portion of each of plurality of first electrodes; and making a second electrode on the organic light emitting layer. However, the organic light emitting layer is formed usually by vacuum evaporation which needs mask, high temperature, and vacuum device. Thus, the method is complicated and high cost.

What is needed, therefore, is to provide a method of making organic light emitting diode which can overcome the shortcomings as described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
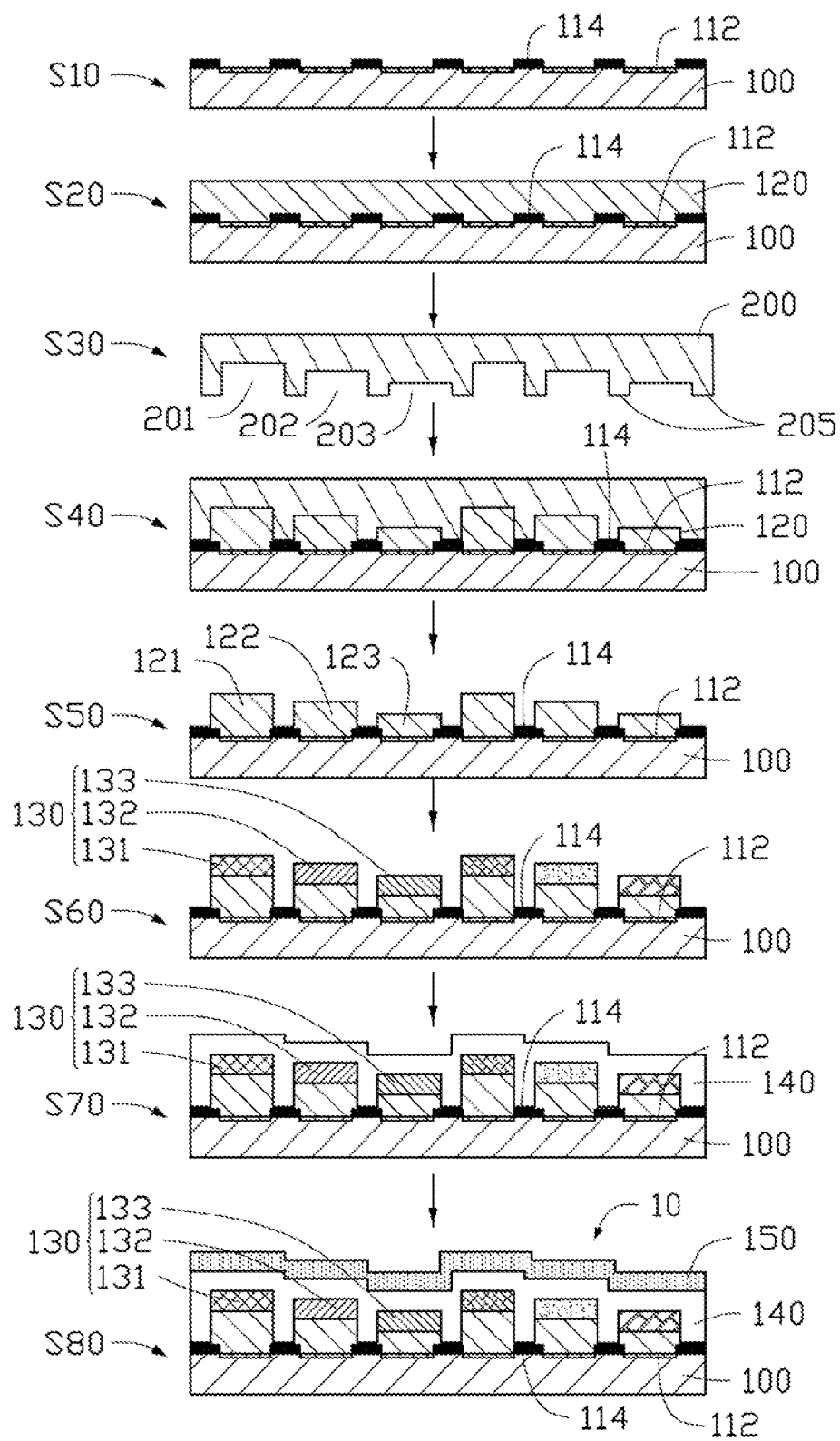
FIG. 1 shows a schematic flowchart of one embodiment of making an organic light emitting diode array.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Referring to FIG. 1, one embodiment of a method for making an organic light emitting diode array 10 comprises following steps:

(S10), providing a base 100 having a plurality of first electrodes 112 on a surface of the base 100;

(S20), depositing a first organic layer 120 on the surface of the base 100 to cover the plurality of first electrodes 112;

(S30), providing a template 200 with a first patterned surface;

(S40), attaching the first patterned surface of the template 200 on the first organic layer 120 and pressing the template 200 toward the first organic layer 120;

(S50), forming a second patterned surface on the first organic layer 120 by separating the template 200 from the first organic layer 120;

(S60), depositing an organic light emitting layer 130 on the second patterned surface of the first organic layer 120;

(S70), forming a second organic layer 140 on the organic light emitting layer 130; and (S80), forming a second electrode 150 electrically connected to the second organic layer 140.

In step (S10), the material of the base 100 can be glass, ceramic, silicon dioxide (SiO2), silicon nitride (SiN) or polymer. The plurality of first electrodes 112 is electrically connected to the first organic layer 120. The plurality of first electrodes 112 can supply driving current for the first electrodes 112, and control the working state of the organic light emitting diode array 10. The plurality of first electrodes 112 are electrical conductive layers and made of conductive oxide, such as indium tin oxide (ITO), indium zinc oxide (IZO), aluminum zinc oxide (AZO), zinc oxide (ZnO) or tin oxide (TO). The material of the first electrode 112 can also be metal such as gold, silver, aluminum, magnesium or alloy thereof. Thus the plurality of first electrodes 112 can also function as a reflecting layer. Furthermore, the plurality of first electrodes 112 can be made of carbon nanotube structure such as carbon nanotube wires or carbon nanotube film. The carbon nanotube structure is a free-standing structure capable of being directly attached on the base 100.

Furthermore, a plurality of barrier walls 114 can be formed on the surface of the base 100. One pixel is defined between every adjacent two of the plurality of barrier walls 114. Each of the plurality of first electrodes 112 is located between adjacent two barrier walls 114.

In step (S20), the first organic layer 120 can comprise a hole transport layer (HTL), or a hole injection layer (HIL). The material of the hole transport layer can be aromatic amines compounds such as Polyaniline (PAN) or triarylamine derivatives. The material of the hole injection layer can be Copper Phthalocyanine (CuPc). In one embodiment, the first organic layer 120 is a hole transport layer. The thickness of the hole transport layer can range from about 50 nanometers to about 300 nanometers.

Figure 2:
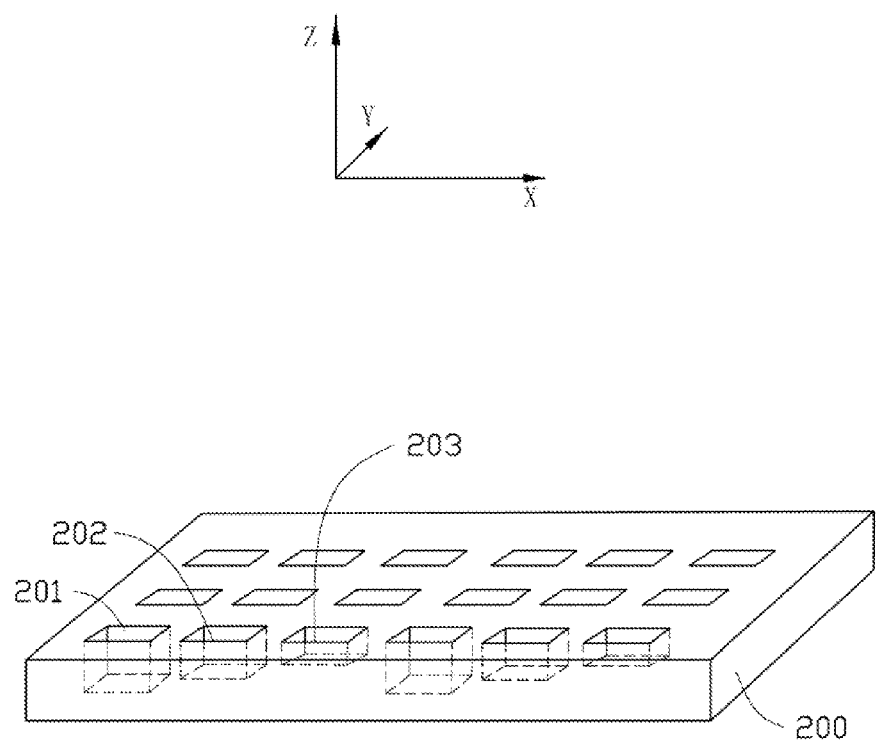
FIG. 2 shows a schematic view of one embodiment of a template with a plurality of convexities arranged in a two-dimensional array in the method of FIG. 1.

In step (S30), further referring to FIG. 2, the template 200 can be made of rigid materials, such as nickel, silicon, and carbon dioxide. The template 200 can also be made of flexible materials, such as PET, PMMA, polystyrene (PS), and polydimethylsiloxane (PDMS). The template 200 can be fabricated through an electron beam lithography method with the nano-pattern formed therein.

The first patterned surface of the template 200 defines a first nano-pattern. The first nano-pattern comprises a plurality of cavities aligned in an array. Furthermore, the first nano-pattern comprises a plurality of first nano-pattern units. The plurality of first nano-pattern units can be aligned in a one-dimensional array or a two-dimensional array. The plurality of first nano-pattern units can be aligned according to desire of the luminous effect of the organic light emitting diode array 10.

In one embodiment, each of the plurality of first nano-pattern units comprises a first groove 201, a second groove 202, and a third groove 203 aligned side by side and spaced from each other. A Z-direction is defined as the direction substantially perpendicular to the first patterned surface. An X-direction and a Y-direction are defined as direction substantially parallel with the first patterned surface. The X-direction is substantially perpendicular to the Y direction. Thus the plurality of first nano-pattern units can be aligned along the X direction to form the one-dimension array. The first groove 201, the second groove 202, and the third groove 203 in each of the plurality of first nano-pattern units can be aligned side by side in a fixed sequence. Thus in one embodiment, the plurality of first grooves 201, the plurality of second grooves 202, and the plurality of third grooves 203 can extend along the Y-direction and be alternately aligned side by side in a manner of "a1-a2-a3-a1-a2-a3 . . . " along the X-direction on the surface of the template 200.

Furthermore, the plurality of first nano-pattern units can also be aligned in the manner of two-dimensional array with a plurality of rows and columns. Thus the plurality of first grooves 201, the plurality of second grooves 202, and the plurality of third grooves 203 can be alternately aligned in the manner of "a1-a2-a3-a1-a2-a3 . . . " along the X-direction. Furthermore, the plurality of first grooves 201, the plurality of second grooves 202, and the plurality of third grooves 203 can be alternately aligned in the manner of "a1-a2-a3-a1-a2-a3 . . . " along the Y-direction.

In one embodiment, the plurality of first nano-pattern units can also be aligned in the manner of two-dimensional array. The plurality of first grooves 201, the plurality of second grooves 202, and the plurality of third grooves 203 can be alternately aligned in the manner of "a1-a2-a3-a1-a2-a3 . . . " along the X-direction. Along the Y-direction, the plurality of first grooves 201 aligned in the same row have the same X coordinate, the plurality of second grooves 202 aligned in the same row have the same X coordinate, and the plurality of third grooves 203 aligned in the same row have the same X coordinate.

The first groove 201, the second groove 202, and the second groove 203 are spaced from each other with a certain distance. Each of the first groove 201, the second groove 202, and the second groove 203 is a concave. A protruding structure 205 is formed between adjacent two concaves.

The first groove 201, the second groove 202, and the third groove 203 have different depths which can be selected according to the thickness of the first organic layer 120, ensuring that first nano-pattern can be successively and completely transferred onto the first organic layer 120. In one embodiment, the first groove 201 has a first depth $d_1$; the second groove 202 has a second depth $d_2$, and the third groove 203 has a third depth $d_3$. The first depth $d_1$, the second depth $d_2$, and the third depth $d_3$ are not the same. In one embodiment, the first depth $d_1$, the second depth $d_2$, and the third depth $d_3$ are different from each other, thus $d_1 \neq d_2 \neq d_3$. Furthermore, the first depth $d_1$, the second depth $d_2$, and the third depth $d_3$ can also satisfy $d_1 \neq d_2 = d_3$, $d_1 = d_2 \neq d_3$, or $d_1 = d_3 \neq d_2$.

The minimum depth $d_{min}$ among the first depth $d_1$, the second depth $d_2$, and the third depth $d_3$ can be smaller than or equal to the thickness of the first organic layer 120. Furthermore, the maximum depth $d_{max}$ can be smaller than or equal to the thickness of the first organic layer 120. Thus the first nano-pattern of the template 200 can be precisely transferred to the first organic layer 120. In one embodiment, the first depth $d_1$, the second depth $d_2$, and the third depth $d_3$ are smaller than the thickness of the first organic layer 120. Furthermore, the first depth $d_1$, the second depth $d_2$, and the third depth $d_3$ satisfy $d_1 > d_2 > d_3$. The first depth $d_1$ can be smaller than or equal to 300 nanometers. The second depth $d_2$ can be greater than 50 nanometers and smaller than or equal to 300 nanometers. The third depth $d_3$ can be greater than 20 nanometers and smaller than or equal to 250 nanometers.

The cross section of the first groove 201, the second groove 202, or the third groove 203 along Z-direction can be in a shape of triangle, rectangle, circle, or square. In one embodiment, the cross section is in the shape of rectangle. A length of the rectangle can range from about 21 micrometers to about 122 micrometers. A width of the rectangle can range from about 5 micrometers to about 98 micrometers. The distance between the first groove 201, the second groove 202, and the third groove 203 can range from about 10 micrometers to about 89 micrometers. In one embodiment, the distance between the first groove 201, the second groove 202, and the third groove 203 is about 15 micrometers.

In step (S40), the template 200 is pressed towards the first organic layer 120 at room temperature. In one embodiment, the template 200 is pressed towards the first organic layer 120 at room temperature in a vacuum environment of about $1 \times 10^{-1}$ millibars to about $1 \times 10^{-5}$ millibars. The pressure applied on the template 200 is about 2 pounds per square inches to about 100 pounds per square inches. The pressure is applied on the template 200 for about 2 minutes to about 30 minutes.

During this process, the first organic layer 120 will be patterned. In one embodiment, each of the first groove 201, the second groove 202, and the third groove 203 faces to one of the plurality of first electrode 112. Thus a plurality of protruding structures will be formed on the first organic layer 120, and each of the plurality of protruding structures will be located on one of the first electrode 112. Furthermore, each of the plurality of protruding structures is located between adjacent two barrier walls 114. Thus the organic light emitting diode array 10 is convenient to be driven by the plurality of first electrodes 112.

In one embodiment, because of the first nano-pattern units in the first patterned surface of the template 200, the thickness of the first organic layer 120 at different portions will be gradually changed according to the depth difference between the first groove 201, the second groove 202, and the third groove 203.

During pressing the template 200 toward the first organic layer 120, because the first depth $d_1$, the second depth $d_2$, and the third depth $d_3$ satisfy $d_1 > d_2 > d_3$, the pressing process comprises three stages:

first stage, the third depth $d_3$ of the third groove 203 is smallest, thus a first portion of the first organic layer 120 corresponding to the third groove 203 will be pressed, and the thickness of the first portion will be getting thinner;

second stage, a second portion of the first organic layer 120 corresponding to the second groove 202 will be pressed, and the thickness of the second portion and the first portion will be getting thinner;

third stage, a third portion of the first organic layer corresponding to the first groove 201 can be pressed.

Thus a plurality of second nano-pattern units will be formed on the surface of the first organic layer 120 according to the plurality of first nano-pattern units. The plurality of second nano-pattern units are coupled with the plurality of first nano-pattern units. Because the plurality of first nano-pattern units form a two-dimensional array, the plurality of second nano-pattern units are also aligned along a two-dimensional array. In detail, each of the plurality of second nano-pattern units comprises a first protruding structure 121, a second protruding structure 122, and a second protruding structure 123. The first protruding structure 121 is coupled with the first groove 201. The second protruding structure 122 is coupled with the second groove 202. The third protruding structure 123 is coupled with the third groove 203.

Figure 3:
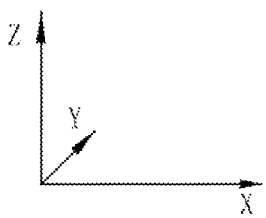
FIG. 3 shows a schematic view of one embodiment of a patterned first organic layer in the method of FIG. 1.
Figure 3:
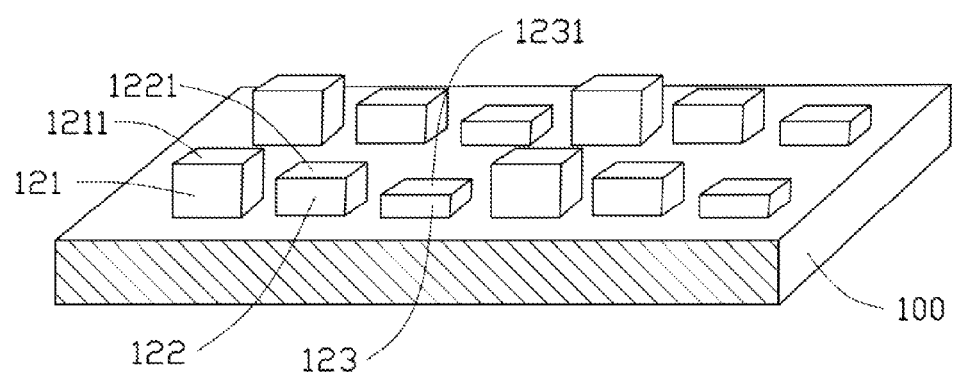

In step (S50), referring to FIG. 3, after the template 200 is separated, the first patterned surface is transferred to the first organic layer 120, and the second patterned surface of the first organic layer 120 is formed. The plurality of second nano-pattern units form the second patterned surface of the first organic layer 120. The first protruding structure 121, the second protruding structure 122, and the third protruding structure 123 are spaced from each other. The first protruding structure 121, the second protruding structure 122, and the third protruding structure 123 can be aligned in the manner of "a1-a2-a3-a1-a2-a3 . . . " along the X-direction.

The first protruding structure 121, the second protruding structure 122, and the third protruding structure 123 extend from the surface of the base 100. The heights of the first protruding structure 121, the second protruding structure 122, and the third protruding structure 123 cannot be same. In one embodiment, a first height $h_1$ of the first protruding structure 121, a second height $h_2$ of the second protruding structure 122, and a third height $h_3$ of the third protruding structure 123 are different from each other, thus $h_1 \neq h_2 \neq h_3$. Furthermore, the first height $h_1$, the second height $h_2$, and the third height $h_3$ can satisfy $h_1 \neq h_2 = h_3$, $h_1 = h_2 \neq h_3$, or $h_1 = h_3 \neq h_2$. In one embodiment, because the first depth $d_1$, the second depth $d_2$, and the third depth $d_3$ satisfy $d_1 > d_2 > d_3$, thus the first height $h_1$, the second height $h_2$, and the third height $h_3$ satisfy $h_1 > h_2 > h_3$.

Furthermore, during pressing the template 200, a fourth portion of the first organic layer 120 corresponding to the protruding structure 205 will be getting thinner and left on the base 100. Thus a step of removing residual fourth portion of the first organic layer 120 can be applied. The residual fourth portion can be removed via plasma etching. The second nano-pattern of the first organic layer is substantially not affected during the process of plasma etching.

In step (S60), the organic light emitting layer 130 is located on the first organic layer 120 via spinning method, inkjet printing method, or vacuum evaporation method. The organic light emitting layer 130 can be deposited on top surfaces of the first protruding structure 121, the second protruding structure 122, and the second protruding structure 123. In one embodiment, the organic light emitting layer 130 comprises a first organic light emitting layer 131, a second organic light emitting layer 132, and a third organic light emitting layer 133. The first organic light emitting layer 131 is located on a first top surface 1211 of the first protruding structure 121. The second organic light emitting layer 132 is located on a second top surface 1221 of the second protruding structure 122. The third organic light emitting layer 133 is located on a third top surface 1231 of the third protruding structure 123. Thus the first organic light emitting layer 131, the second organic light emitting layer 132, and the third organic light emitting layer 133 are spaced from each other.

The material of the organic light emitting layer 130 can be any organic electroluminescent high or low molecular materials that can be made in to solution, such as polyfluorene (PF), or aluminum tris(8-hydroxyquinoline). The thickness of the organic light emitting layer 130 can be in a range from about tens nanometers to about hundreds nanometers, for example, from about 50 nanometers to about 300 nanometers.

Furthermore, the thickness of the first organic light emitting layer 131, the second organic light emitting layer 131, and the third organic light emitting layer 133 can be same or different from each other.

The light emitting material of the first organic light emitting layer 131, the second organic light emitting layer 132, and the third organic light emitting layer 133 can be the same in order to emit same light such as red light, green light, blue light, or white light. Furthermore, the light emitting material of the first organic light emitting layer 131, the second organic light emitting layer 132, and the third organic light emitting layer 133 can be different to emit different lights. The light emitting material of the first organic light emitting layer 131, the second organic light emitting layer 132, and the third organic light emitting layer 133 can be selected according to the first height $h_1$, the second height $h_2$, and the third height $h_3$. The light emitting material capable of emitting light with long wavelength can be applied on a higher protruding structure such as the first protruding structure 121. Thus the organic light emitting diode array 10 can uniformly emit white light.

In one embodiment, the light emitting material of the first organic light emitting layer 131 is a red-light-emitting material (R). The light emitting material of the second organic light emitting layer 132 is a green-light-emitting material (G). The light emitting material of the third organic light emitting layer 133 is a blue-light-emitting material (B). The first organic light emitting layer 131, the second organic light emitting layer 132, and the third organic light emitting layer 133 can work together as one pixel unit, and each of the first organic light emitting layer 131, the second organic light emitting layer 132, and the third organic light emitting layer 133 is functioned as one sub-pixel. Furthermore, each of the first organic light emitting layer 131, the second organic light emitting layer 132, and the third organic light emitting layer 133 can also be functioned as one pixel unit.

In one embodiment, the first organic light emitting layer 131, the second organic light emitting layer 132, and the third organic light emitting layer 133 can be aligned in a manner of RGB-RGB-RGB . . . along the X-direction on the first organic layer 120.

Because the first protruding structure 121, the second protruding structure 122, and the third protruding structure 123 have different heights on the base 100. Thus the first organic light emitting layer 131, the second organic light emitting layer 132, and the third organic light emitting layer 133 have height difference from the surface of the base 100. Thus the luminesce effect of the organic light emitting diode array 10 can be improved.

In step (S70), the second organic layer 140 can be an electron transport layer (ETL) or an electron injection layer (EIL). The material of the electronic transport layer can be aromatic compounds with a larger conjugate planar. The material of the electronic injection layer can be alkali metal or alkali metal compounds with low work function, such as lithium fluoride (LiF), Calcium (Ca), Magnesium (Mg), etc. In one embodiment, the second organic layer 140 is an electronic transport layer. The second organic layer 140 can be merely located on top surfaces of the first organic light emitting layer 131, the second organic light emitting layer 132, and the third organic light emitting layer 133. Because the first protruding structure 121, the second protruding structure 122, and the third protruding structure 123 have different heights, thus a surface of the second organic layer 140 away from the base 100 forms a patterned surface.

In step (S80), the second electrode 150 can be formed by deposition, evaporation, or printing. The second electrode 150 can be a transparent thin layer with low work function. The thickness of the second electrode 150 can range from about $5 \times 10^{-9}$ meters to about $30 \times 10^{-9}$ meters. Because the second electrode 150 is very thin with great transmittance, thus it does not affect the light-emitting efficiency of organic light-emitting diodes 10. The second electrode 150 can also be a stack structure with a variety of metal layers, such as lithium/aluminum/silver (Li/Al/Ag), calcium/aluminum (Ca/Al), or magnesium/silver (Mg/Ag). Furthermore, the second electrode 150 can comprise carbon nanotube yarns or carbon nanotube film.

The second electrode 150 and the first electrode 112 are worked together to provide voltage and current. In one embodiment, the first electrode 112 is functioned as the anode of the organic light emitting diode array 10. The second electrode 150 is functioned as the cathode of the organic light emitting diode array 10.

While the material of the second electrode 150 is metal, the second electrode 150 can also be used as a reflector. The lights can be reflected by the second electrode 150 and emit from the surface of the base 100. Furthermore, a reflector layer (not shown) can be applied on the second electrode 150 to reflect the lights.

Furthermore, a thin film transistor (TFT) array can be applied on the base 100. The thin film transistor array is electrically connected to the plurality of first electrodes 112. Thus the working state of each organic light emitting diode in the organic light emitting diode array 10 can be controlled by the thin film transistor. Then the organic light emitting diode array 10 forms an active matrix organic light emitting diode (AMOLED) array.

Furthermore, a hole injection layer (not shown) can be applied on the surface of the base 100 before the step (S20).

Furthermore, an electron injection layer (not shown) can be applied on the surface of the second organic layer 140 before step (S70).

The method of making light emitting diode array 10 has following advantages. The plurality of protruding structures with different heights can be simply formed on the first organic layer via nano-imprinting method, thus the mask layer can be omitted. The damage to the first organic layer during changing the mask layer can be avoided. Thus the luminesce effect and life-span of the organic light emitting diode can be improved. The method is low in cost. Furthermore, because the nano-pattern of the template can have a high resolution, thus the resolution of the organic light emitting diode can have a resolution higher than 500 ppi (pixels per inch). The method of making organic light emitting diode can be suitable for roll-to-roll process, thus the production efficiency is improved.

It is to be understood that the described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The disclosure illustrates but does not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method of making organic light emitting diode array, the method comprising:

providing a base having a plurality of first electrodes on a surface of the base, wherein each of the plurality of first electrodes is located between adjacent two barrier walls;

depositing a first organic layer on the surface of the base to cover the plurality of first electrodes, wherein the first organic layer is a continuous structure, and a material of the first organic layer is Polyaniline or Copper Phthalocyanine;

providing a template with a first patterned surface, wherein the first patterned surface comprises a first groove, a second groove, and a third groove, and a first depth $d_1$ of the first groove, a second depth $d_2$ of the second groove, and a third depth $d_3$ of the third groove are different;

attaching the first patterned surface of the template on the first organic layer and pressing the template toward the first organic layer, wherein the template is pressed towards the first organic layer at room temperature in a vacuum environment of about $1 \times 10^{-1}$ millibars to about $1 \times 10^{-5}$ millibars, a pressure applied on the template is about 2 pounds per square inches to about 100 pounds per square inches, and the pressure is applied on the template for about 2 minutes to about 30 minutes;

forming a second patterned surface on the first organic layer by separating the template from the first organic layer;

depositing an organic light emitting layer on the second patterned surface of the first organic layer;

forming a second organic layer on the organic light emitting layer; and forming a second electrode electrically connected to the second organic layer.

2. The method of claim 1, wherein the first patterned surface defines a first nano-pattern comprising a plurality of first nano-pattern units spaced from each other.

3. The method of claim 2, wherein the plurality of first nano-pattern units are aligned in a one-dimensional array or a two-dimensional array.

4. The method of claim 2, wherein each of the plurality of first nano-pattern units comprises the first groove, the second groove, and the third groove aligned side by side and spaced from each other.

5. The method of claim 4, wherein the first groove, the second groove, and the third groove in each of the plurality of first nano-pattern units are aligned side by side in that sequence.

6. The method of claim 4, wherein a first depth $d_1$ of the first groove, a second depth $d_2$ of the second groove, and a third depth $d_3$ of the third groove satisfy $d_1 > d_2 > d_3$.

7. The method of claim 1, wherein the first depth $d_1$ is smaller than or equal to 300 nanometers; the second depth $d_2$ is greater than 50 nanometers and smaller than or equal to 300 nanometers; the third depth $d_3$ is greater than 20 nanometers and smaller than or equal to 250 nanometers.

8. The method of claim 1, wherein the second patterned surface is coupled with the first patterned surface, and the second patterned surface comprises a plurality of second nano-pattern units spaced from each other.

9. The method of claim 8, wherein each of the plurality of second nano-pattern units comprises a first protruding structure, a second protruding structure, and a third protruding structure aligned side by side and spaced from each other.

10. The method of claim 9, wherein a first height $h_1$ of the first protruding structure, a second height $h_2$ of the second protruding structure, and a third height $h_3$ of the third protruding structure satisfy $h_1 > h_2 > h_3$.

11. The method of claim 9, wherein the depositing the organic light emitting layer on the second patterned surface of the first organic layer comprises forming a first organic light emitting layer on a first top surface of the first protruding structure, forming a second organic light emitting layer on a second top surface of the second protruding structure, and forming a third organic light emitting layer on a third top surface of the third protruding structure; and light emitting materials of the first organic light emitting layer, the second organic light emitting layer, and the third organic light emitting layer are not the same.

12. The method of claim 11, wherein the light emitting material of the first organic light emitting layer is a red-light-emitting material, the light emitting material of the second organic light emitting layer is a green-light-emitting material, the light emitting material of the third organic light emitting layer is a blue-light-emitting material.

13. The method of claim 11, wherein the first organic light emitting layer, the second light organic light emitting layer, and the third organic light emitting layer have the same thickness.

14. The method of claim 11, wherein the second organic layer covers the first organic light emitting layer, the second organic light emitting layer, and the third organic light emitting layer.

15. The method of claim 1, wherein the plurality of first electrodes are formed by directly attaching a plurality of carbon nanotube wires or a carbon nanotube film on the base.

16. The method of claim 1, wherein the pressing the template toward the first organic layer comprises following stages:

first stage, a third depth $d_3$ of the third groove is smallest, a first portion of the first organic layer corresponding to the third groove is pressed, a thickness of the first portion is getting thinner;

second stage, a second portion of the first organic layer corresponding to the second groove is pressed, and a thickness of the second portion and the first portion are getting thinner;

third stage, a third portion of the first organic layer corresponding to the first groove is pressed.

17. A method of making organic light emitting diode array, the method comprising:

providing a base having a plurality of first electrodes on a surface of the base, wherein each of the plurality of first electrodes is located between adjacent two barrier walls;

depositing a first organic layer on the surface of the base to cover the plurality of first electrodes, wherein the first organic layer is a continuous structure, and a material of the first organic layer is Polyaniline or Copper Phthalocyanine;

providing a template with a first patterned surface, wherein the first patterned surface comprises a first groove, a second groove, and a third groove, and a first depth $d_1$ of the first groove, a second depth $d_2$ of the second groove, and a third depth $d_3$ of the third groove are different;

attaching the first patterned surface of the template on the first organic layer and pressing the template toward the first organic layer, wherein the template is pressed towards the first organic layer at room temperature;

forming a second patterned surface on the first organic layer by separating the template from the first organic layer;

depositing an organic light emitting layer on the second patterned surface of the first organic layer;

forming a second organic layer on the organic light emitting layer; and forming a second electrode electrically connected to the second organic layer.

* * * * *